(12) United States Patent
Marcu

(10) Patent No.: US 10,693,477 B1
(45) Date of Patent: Jun. 23, 2020

(54) VOLTAGE-TO-CURRENT CONVERTER CIRCUIT

(71) Applicant: Apple Inc., Cupertino, CA (US)

(72) Inventor: Cristian Marcu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/360,787

(22) Filed: Mar. 21, 2019

(51) Int. Cl.
*H03L 7/06* (2006.01)
*H03L 7/08* (2006.01)
*H03L 7/099* (2006.01)
*H03L 7/10* (2006.01)
*H03F 3/45* (2006.01)

(52) U.S. Cl.
CPC ......... *H03L 7/102* (2013.01); *H03F 3/45071* (2013.01); *H03L 7/099* (2013.01); *H03L 7/104* (2013.01)

(58) Field of Classification Search
CPC ......... H03L 7/102; H03L 7/099; H03L 7/104; H03F 3/45071
See application file for complete search history.

(56) References Cited

U.S. PATENT DOCUMENTS

| | | | | |
|---|---|---|---|---|
| 5,594,390 A | * | 1/1997 | Holzer | G05F 3/242 331/17 |
| 8,432,204 B1 | | 4/2013 | Chern et al. | |
| 8,971,832 B2 | | 3/2015 | Bult et al. | |
| 9,935,666 B2 | | 4/2018 | Lee et al. | |
| 2011/0006820 A1 | * | 1/2011 | Liu | H03L 7/093 327/157 |
| 2017/0250692 A1 | * | 8/2017 | Motozawa | H03L 7/087 |

* cited by examiner

*Primary Examiner* — Kenneth B Wells
(74) *Attorney, Agent, or Firm* — Kowert, Hood, Munyon, Rankin & Goetzel, P.C.

(57) ABSTRACT

An oscillator subsystem included in a phase-locked loop circuit of a computer system may include coarse and fine-tuning circuits. The coarse-tuning circuit may generate a coarse-tuning current based on a reference voltage, and the fine-tuning circuit may generate a fine-tuning current by combining respective currents generated by first and second complement current mirror circuits using a voltage level of a control signal. An oscillator circuit may generate a clock signal whose frequency is based on a combination of the coarse and fine-tuning circuits.

15 Claims, 6 Drawing Sheets

VOLTAGE-TO-CURRENT CONVERTER CIRCUIT

BACKGROUND

Technical Field

This disclosure relates to power management in computer systems and more particularly to voltage to current converter circuit operation.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate using different clock signals, which provide a timing reference for various sub-circuits within the circuit blocks. For example, in some circuit blocks, a clock signal may be used to trigger the transition of a flip-flop circuit from one state to another. Alternatively, a clock signal may be used to activate a latch circuit in order to capture a data state of signal.

Various circuits may be used to generate the various clock signals used in an integrated circuit. For example, a crystal oscillator may be used to generate a reference clock signal. Additional clocks signals of various frequencies may be generated using phase-locked loop circuits, delay-locked loop circuits, and the like. Circuits like phase-locked loop circuits may employ oscillator circuits whose frequency can be adjusted by changing a level of a control current or voltage.

SUMMARY OF THE EMBODIMENTS

Various embodiments for an oscillator subsystem are disclosed. Broadly speaking, a coarse-tuning circuit may be configured to generate, based on a reference voltage level, a coarse-tuning current. A first current mirror circuit, included in a fine-tuning circuit, that is coupled to a power supply signal may be configured to generate a first current based on a voltage level of a control signal. A second current mirror circuit, included in the fine-tuning circuit, that is coupled to a ground supply signal may be configured to generate a second current based on the voltage level of the control signal. The fine-tuning circuit may be configured to generate a fine-tuning current using the first and second currents. An oscillator circuit may be configured to generate a clock signal whose frequency is based on a combination of the coarse-tuning current and the fine-tuning current. In one embodiment, to generate the fine-tuning current, the fine-tuning circuit may be further configured to sum the first current and the second current

Figure 1:
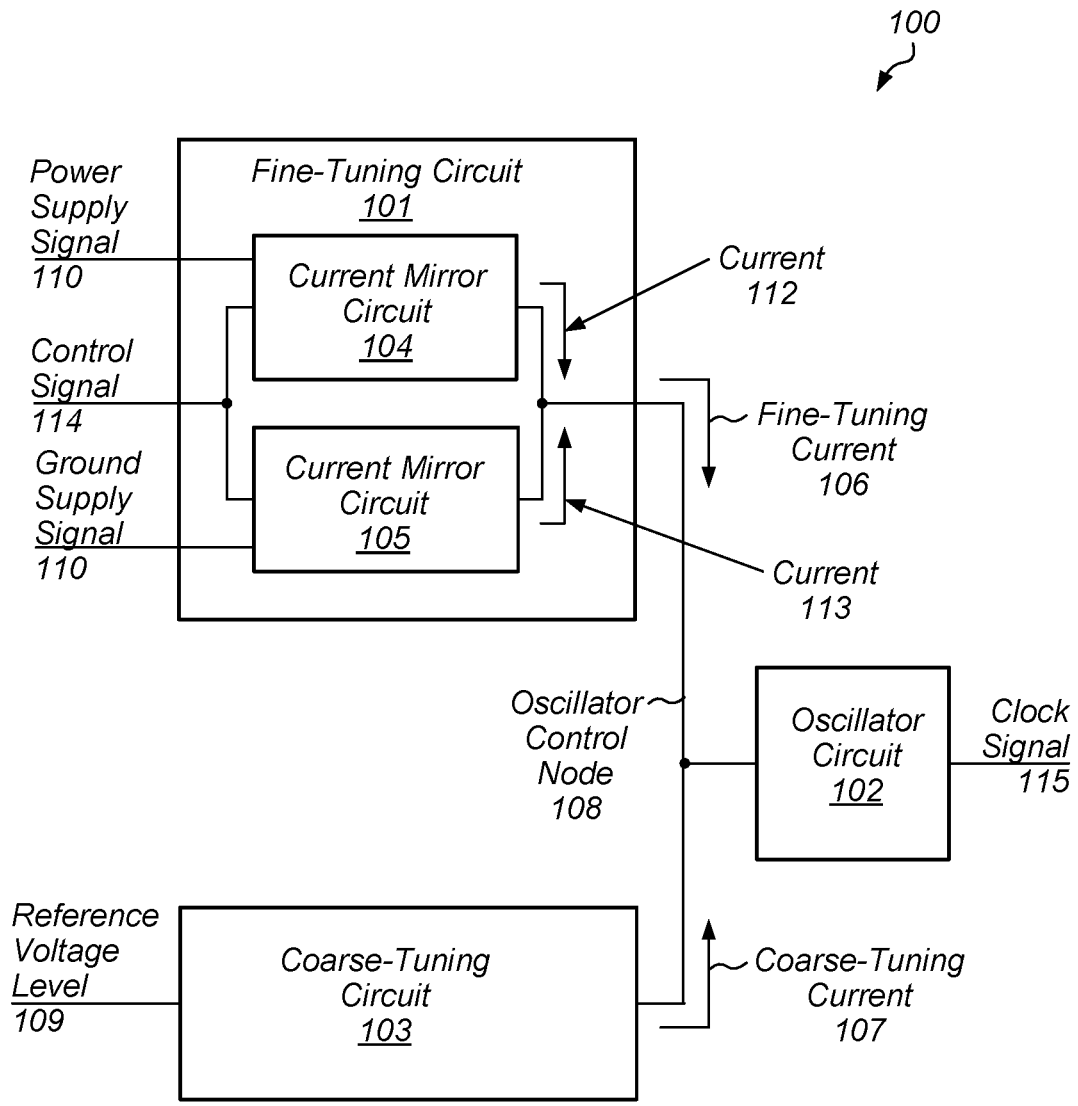
FIG. 1 is a block diagram of an embodiment of an oscillator subsystem.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may operate at different frequencies. To allow for different frequencies of operation, a computer system may employ different clock signals, which provide a time reference for circuits within the circuit blocks. Computer systems may include multiple clock generation circuits to generate the different clock signals. Such clock generation circuit may include phase-locked loop (PLLs), delay-locked loops (DLL), or other suitable circuits configured to generate a periodic signal suitable for use as a clock.

Phase-locked loop circuits typically include an oscillator circuit configured to generate a clock signal whose frequency is based on a control signal generated based on a comparison of a phase of the clock signal to the phase of a reference signal. By adjusting the control signal, any phase difference between the clock signal, or frequency-divided version of the clock signal, to the reference signal may be reduced to desired levels.

In some low-frequency phase-locked loop circuits, current-starved ring oscillators may be employed. In such ring oscillators, a time for a transition of the clock signal to pass through a stage of the ring oscillator is based on an amount of current supplied to the stage. In order to provide the current for the stages in a current-starved ring oscillator, the voltage level of the control signal must be translated to a corresponding control current.

In order to keep a phase-locked loop that employs a current-starved ring oscillator stable, the voltage-to-frequency gain (commonly referred to as "Kv") should be constant over the range of voltage value for the control signal as well as different coarse-tuning settings for the loop. The voltage-to-frequency gain of existing circuits, however, can approach zero when the voltage level of the control signal is close to either the voltage level of the power supply or ground potential. When the voltage-to-frequency gain approaches zero, the phase-locked loop may become unstable. The embodiments illustrated in the drawings and described below provide techniques for generating a control current using the entire operating voltage range of the control signal without a loss in voltage-to-frequency gain, thereby preventing instability within a control loop of a phase-locked loop or other suitable circuit.

A block diagram depicting an embodiment of an oscillator subsystem is depicted in FIG. 1. As illustrated, oscillator subsystem 100 includes fine-tuning circuit 101, oscillator circuit 102, and coarse-tuning circuit 103.

Coarse-tuning circuit 103 is configured to generate, based on reference voltage level 109, coarse-tuning current 107. As used herein, a coarse-tuning circuit is a circuit that generates a current for controlling an oscillator circuit using a reference voltage. Different values for the reference voltage may be used to set the oscillator circuit to oscillate at a frequency at or near a desired frequency. As described below in more detail, coarse-tuning circuit 103 may include a comparator or other suitable circuit configured to compare reference voltage level 109 to a voltage level generated internal to coarse-tuning circuit 103 using coarse-tuning current 107.

Fine-tuning circuit 101 includes current mirror circuit 104 and current mirror circuit 105. As used herein, a fine-tuning circuit is a circuit that generate a current for controlling an oscillator circuit using results of a phase comparison (such as in a phase-locked loop circuit) between the output of the oscillator circuit and a reference clock signal. In some cases, the fine-tuning current may be combined with a coarse-tuning circuit to generate a composite current for controlling the oscillator circuit. By employing both a coarse-tuning circuit and a fine-tuning circuit to generate a control current for an oscillator circuit, a time for the oscillator circuit to achieve a desired frequency may be reduced.

As illustrated, current mirror circuit 104 is coupled to power supply signal 110 and is configured to generate current 112 based on a voltage level of control signal 114. Current mirror circuit 105 is coupled to ground supply signal 111 and is configured to generate current 113 based on the voltage level of control signal 114. Using currents 112 and 113, fine-tuning circuit 101 is configured to generate fine-tuning current 106. In some embodiments, to generate fine-tuning current 106, the fine-tuning circuit is further configured to sum currents 112 and 113. Although two current mirror circuits are depicted as being included in fine-tuning circuit 101, in other embodiments, any suitable number of current mirror circuits may be employed.

Oscillator circuit 102 is coupled to fine-tuning circuit 101 and coarse-tuning circuit 103 via oscillator control node 108, and is configured to generate clock signal 115. A frequency of clock signal 115 is based on a combination of coarse-tuning current 107 and fine-tuning current 106.

In various embodiments, oscillator circuit 102 is a particular embodiment of a current-starved ring oscillator circuit and includes a plurality of stages arranged in a daisy-chain fashion to form a ring. A time to propagate a transition of clock signal 115 through a particular stage of the plurality of stages is based on a current flowing through oscillator control node 108.

Figure 2:
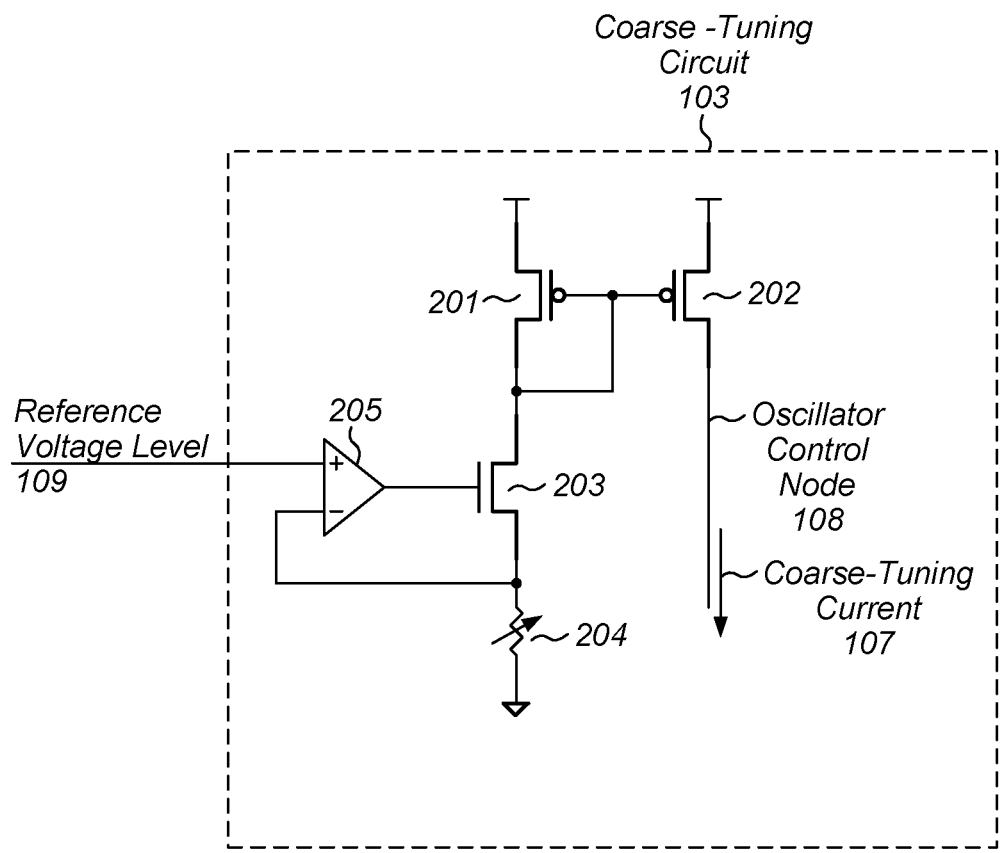
FIG. 2 illustrates a block diagram of an embodiment of a coarse-tuning circuit.

A block diagram of an embodiment of coarse-tuning circuit 103 is depicted in FIG. 2. As illustrated, coarse-tuning circuit 103 includes devices 201, 202, and 204, variable resistor 204, and comparator 205.

Each of devices 201 and 202 are coupled to a power supply node. The control terminals of devices 201 and 202 are coupled together and coupled to device 203. The particular arrangement of devices 201 and 202 illustrated in FIG. 2 is commonly referred to as a current mirror circuit, where a current flowing through device 201 is duplicated (or "mirrored") in device 202. In this case, device 202, mirrors the current flowing through device 201, generating coarse-tuning current 107, which is sourced to oscillator control node 108. In some embodiments, a difference in voltage-to-current gain between devices 201 and 202 can increase the value of coarse-tuning current 107 relative to the current flowing through device 201.

The current through device 201 is determined, in part, by the device 203, which is coupled between device 201 and variable resistor 204. The control terminal of device 203 is controlled by the output of comparator 205. As a voltage level of the output of comparator 205 increases, a resistance of device 203 decreases allowing more current to flow through device 201. Alternatively, if the voltage level of the output of comparator 205 decreases, device 203 becomes less conductive, thereby decreasing the current flowing through device 201.

Devices 201 and 202 may, in various embodiments, be particular embodiments of p-channel metal-oxide semiconductor field-effect transistors (MOSFETs). Device 203 may be a particular embodiment of a n-channel MOSFET. It is noted that in other embodiments, different types of devices, including those fabricated in technologies other than complementary metal-oxide semiconductor (CMOS), may be employed.

Variable resistor 204 is coupled between device 203 and a ground supply. In various embodiments, the current flowing through devices 201 and 203 creates a voltage across variable resistor 204. The voltage across variable resistor 204 affects the gate-to-source voltage of device 203, thereby modifying its voltage-to-current gain. By adjusting the value of variable resistor 204, further adjustment to the current flowing in devices 201 and 203 may be made.

In various embodiments, variable resistors may include multiple resistors (referred to as "unit cells") may from polysilicon, diffusion, or any other suitable material available on a semiconductor manufacturing process used to fabricate oscillator subsystem 100. The multiple resistors may be coupled together using switches, devices, fuses, or any other suitable coupling mechanism that allows for different numbers of the multiple resistors to be used to determine a resistance value of variable resistor 204. In some embodiments, the value of variable resistor 204 may be set during a test phase after manufacture, or may be adjusting during operation of oscillator subsystem 100.

Comparator 205 may be a particular embodiment of a differential amplifier circuit configured to compare a reference voltage level 109 to a voltage level of an intermediate node between device 203 and variable resistor 204. In various embodiments, comparator 205 may include a matched pair of MOSFETs or other suitable transconductance devices, along with bias and other support circuits.

In some cases, a band gap reference circuit, or any other suitable supply and temperature independent voltage reference circuit, may generate reference voltage level 109. Reference voltage level 109 may be selected such that a resultant voltage on control signal 114 during a restart or calibration operation sets a frequency of clock signal 115 that is within a desired margin of error from a desired frequency.

Figure 3:
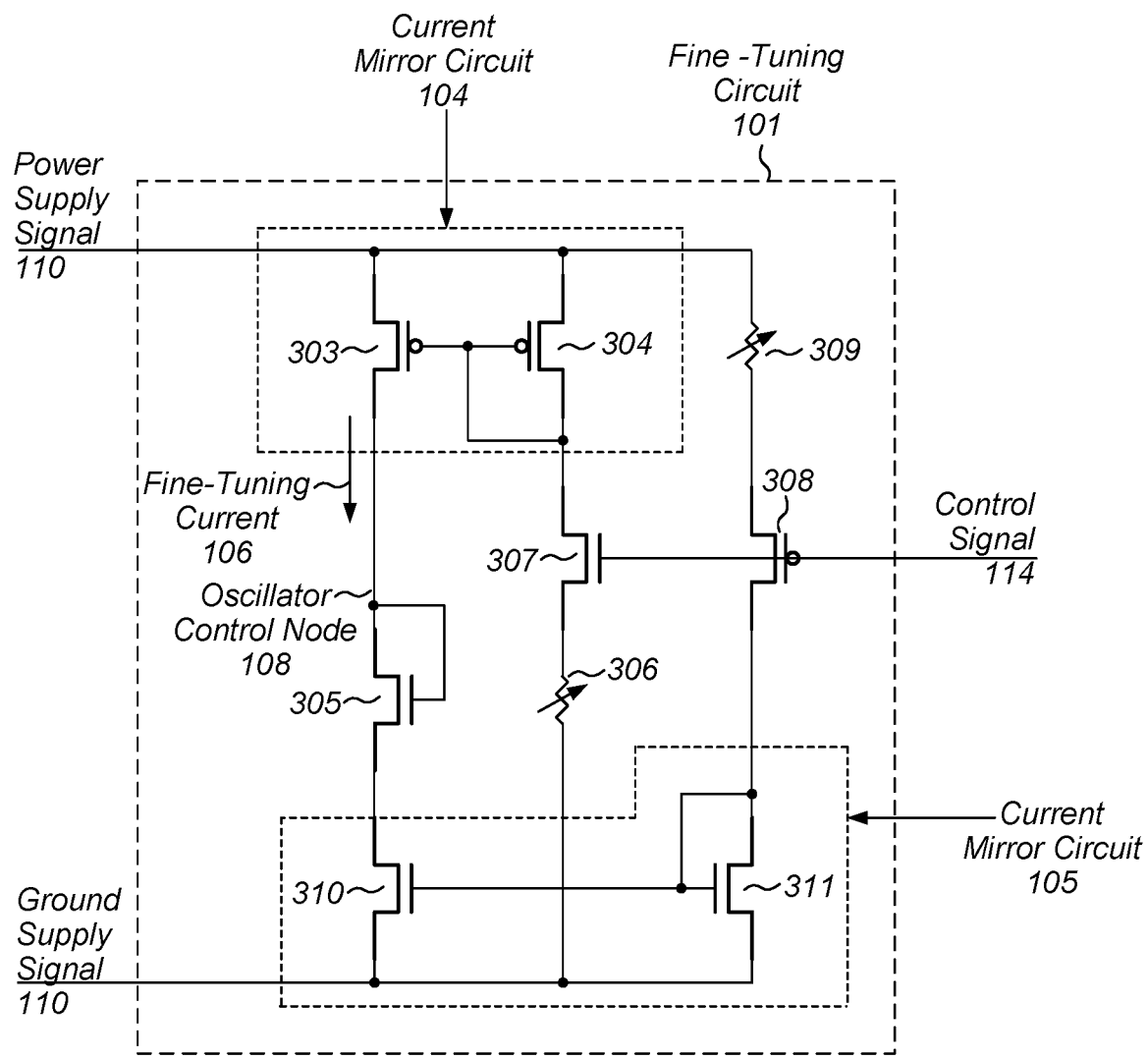
FIG. 3 illustrates a block diagram of an embodiment of a fine-tuning circuit.

As described above, the voltage range of control signal 114 can vary from near ground potential to near the voltage level of the power supply signal. Such a range is commonly referred to as "rail-to-rail." Most voltage-to-current conversion circuits do not function effectively over such a voltage range, with the generated current tending to zero when the voltage level of the control signal is near one of the supply signals. As described above, the lack of generated current near either supply signal can result in a loss of voltage-to-frequency gain in a phase-locked loop or other clock signal generator circuit. A block diagram of an embodiment of fine-tuning circuit 101, which can operate over from rail-to-rail, is depicted in FIG. 3.

To operate over the entire voltage range of control signal 114, fine-tuning circuit 101 employs current mirror circuit 104 and current mirror circuit 105. As illustrated, current mirror circuit 104, which includes devices 303 and 304, and current mirror circuit 105, which includes devices 310 and 311. As illustrated, current mirror circuit 104 and current mirror circuit 105 are complements of each other. As used herein, a particular current mirror is a complement of a different current mirror when the particular current mirror includes different device types and uses a different supply signal than the different current mirror. For example, current mirror circuit 104 includes p-channel MOSFETs and uses a power supply signal, while current mirror circuit 105 includes n-channel MOSFETs and uses a ground supply signal.

By employing complement current mirror circuits, fine-tuning circuit 101 can operate over the entire voltage range of control signal 114 without loss of gain. As described below in more detail, when the voltage level of control signal 114 is close to the voltage level of power supply signal 110, current mirror circuit 104 functions while current mirror circuit 105 does not function. When the voltage level of control signal 114 is close to ground potential, current mirror circuit 105 functions, while current mirror circuit 104 does not function.

Each of devices 303 and 304 are coupled to power supply signal 110 and their respective control terminals are coupled to device 307 in a current mirror configuration. A current flowing through device 304 will result in a current flowing (or being "mirrored") in device 303. In some embodiments a value of the mirrored current, i.e., the current flowing through device 303, can be increased or decreased based on the ratio of transconductance between devices 303 and 304. For example, if the transconductance of device 303 is greater than that of device 304, then the value of the current flowing through device 303 will be greater than the current flowing through device 304. In cases where devices 303 and 304 are p-channel MOSFETs, the transconductances of the devices may be determined by physical dimensions of the devices, so any change in the value for the mirrored current may be based on differences between the physical dimensions of devices 303 and 304.

Device 307 is coupled between device 304 and variable resistor 306, which is, in turn, coupled to power supply signal 110. Device 307 may be a particular embodiment of an n-channel MOSFET and is controlled by control signal 114. The on-resistance of device 307, which is determined by a voltage level of control signal 114, and the value of variable resistor 306 determine an initial current flowing through device 304, which is mirrored by device 303 to generate fine-tuning current 106 flowing through oscillator control node 108.

Since device 307 is an n-channel device, device 307 will only be active when its gate-to-source voltage is greater than its threshold voltage. As such, when the voltage level of control signal 114 is close to that of ground supply signal 111, device 307 will be inactive, resulting in little or no current flowing through devices 307 and 304, resulting in current mirror circuit 104 not contributing to fine-tuning current 106.

Fine-tuning current 106 also flows into device 305, which is coupled to device 303 via oscillator control node 108. Device 305, which is also coupled to device 310, shifts the voltage level of the oscillator control node 108. In various embodiments, device 305 increases the voltage level of oscillator control node 108 to a level that is compatible with oscillator circuit 102. It is noted that in some embodiments, the voltage level of oscillator control node 108 may not need to be shifted. In such cases, device 305 may be omitted from fine-tuning circuit 101, and device 303 coupled to device 310 via oscillator control node 108.

Device 308 is coupled between variable resistor 309 and device 311. Variable resistor 309 is, in turn, coupled to ground supply signal 111. Device 308 may be a particular embodiment of a p-channel MOSFET and is controlled by control signal 114. The on resistance of device 308, which is determined by a voltage level of control signal 114, and the value of variable resistor 309 determine a second initial current flowing through devices 308 and 311.

In a similar fashion to devices 303 and 304, devices 311 and 310 are coupled together in a current mirror configuration. The second initial current generated by device 308 and variable resistors 309 is mirrored by devices 311 and 310 to generate a part of fine-tuning current 106. As with devices 303 and 304, during the mirroring processing the value of the mirrored current that contributes to fine-tuning current 106 may be increased or decreased by adjusting relative transconductances of devices 310 and 311. In cases where devices 310 and 311 are n-channel MOSFETs, modifying the relative physical dimensions of devices 310 and 311 may make adjustments to the mirrored current. In various embodiments, changing the voltage-to-frequency gain of a phase-locked loop circuit including oscillator subsystem 100 may include adjusting physical dimensions of devices 303 and 304, as well as devices 310 and 311.

Since device 308 is an p-channel device, device 308 will only be active when its gate-to-source voltage is greater than its threshold voltage. As such, when the voltage level of control signal 114 is close to that of power supply signal 110, device 308 will be inactive, resulting in little or no current flowing through devices 308 and 311, resulting in current mirror circuit 105 not contributing to fine-tuning current 106.

Variable resistors 306 and 309 may be constructed in a similar fashion as variable resistor 204 using multiple unit cells. In various embodiments, the number and value of the units cells used in variable resistors 306 and 309 may be the same as those used in variable resistor 204. In order to maintain a constant ratio between coarse-tuning current 107 and fine-tuning current 106.

Figure 4:
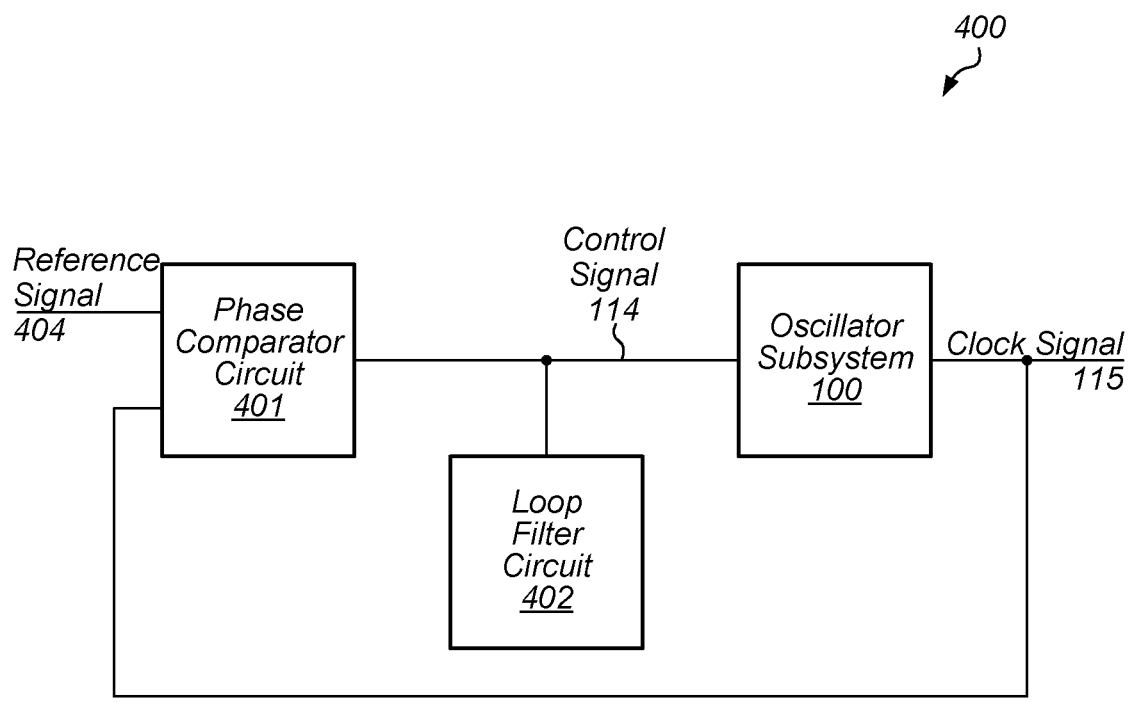
FIG. 4 illustrates a block diagram of an embodiment of a phase-locked loop circuit.

Turning to FIG. 4, an embodiment of a phase-locked loop circuit is depicted. As illustrated, phase-locked loop circuit 400 includes phase comparator circuit 401, loop filter circuit 402, and oscillator subsystem 100. As described above, oscillator subsystem 100 is configured to generate clock signal 115 such that a frequency of clock signal 115 is based on a voltage level of control signal 114.

Phase comparator circuit 401 is configured to compare a phase of clock signal 115 to a phase of reference signal 404 and adjust a voltage level of control signal 114 based on results of comparing the phases of clock signal 115 and reference signal 404. In various embodiments, reference signal 404 may be generated by another oscillator circuit (e.g., a crystal oscillator) and used by other phase-locked loops as a reference.

In some embodiments, phase comparator circuit 401 may include at least two flip-flop circuits coupled to clock signal 115 and reference signal 404, respectively. Additional logic gates coupled to the two flip-flop circuits may be configured to generate up and down signals for controlling a charge pump circuit coupled to control signal 114. Based on the up and down signals, the charge pump circuit will source or sink a particular amount of current to or from control signal 114, thereby adjusting the voltage level of control signal 114. By adjusting the voltage level of control signal 114, the frequency of clock signal 115 is adjusted in order reduce a phase difference between clock signal 115 and reference signal 404.

Loop filter circuit 402 is configured to attenuate certain frequency components of control signal 114, thereby reducing jitter in the frequency of clock signal 115. In various embodiments, loop filter circuit may include any suitable combination of resistors, capacitors, and the like, configured to provide a low-impedance path to ground for a range of frequencies included in control signal 114.

Although it is depicted that clock signal 115 is input to phase comparator circuit 401, in other embodiments, a frequency divider circuit (not shown) may be employed to reduce the frequency of clock signal 115 before the phase comparison. Using a frequency divider circuit in this fashion may allow for clock signal 115 to have any suitable frequency.

Figure 5:
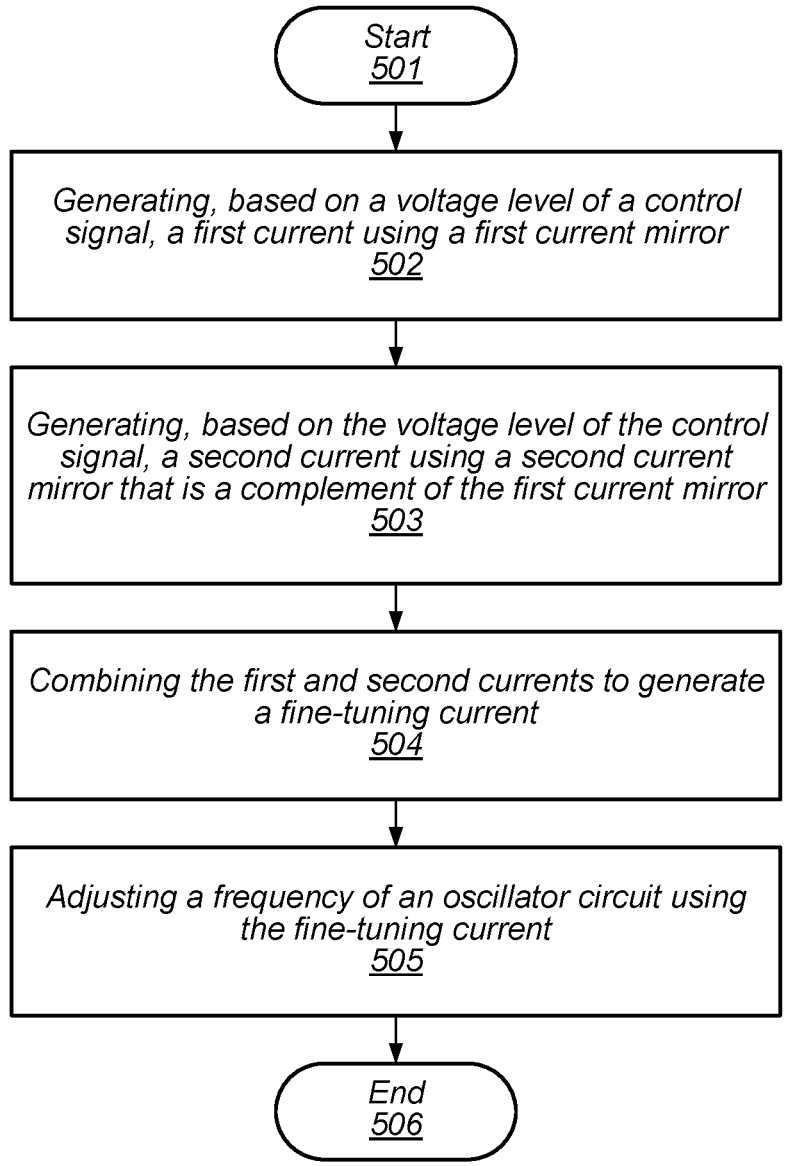
FIG. 5 illustrates a flow diagram depicting an embodiment of a method for operating an oscillator subsystem.

Turning to FIG. 5, a flow diagram depicting an embodiment of a method for operating an oscillator subsystem to generate a clock signal is illustrated. The method, which may be applied to various oscillator subsystem, e.g., oscillator subsystem 100, begins in block 501.

The method includes generating, based on a voltage level of a control signal, a first current using a first current mirror (block 502). In some cases, the method includes filtering the control signal. By filtering the control signal, high frequency variations in the voltage level of the control signal may be attenuated, thereby preventing jitter in the frequency of the clock signal.

The method further includes generating, based on the voltage level of the control signal, a second current using a second current mirror that is a complement of the first current mirror (block 503). In some cases, the method also includes adjusting the first current using a first variable resistor and adjusting the second current using a second variable resistor. As described above, the variable resistors may be constructed from a similar number and type of unit cells.

The method also includes combining the first and second currents to generate a fine-tuning current (block 504) and adjusting a frequency of an oscillator circuit using the fine-tuning current (block 505). In some embodiments, the method further includes generating the control signal based on a comparison of the frequency of the oscillator circuit and a reference signal. As described above, based on results of the comparison, the voltage level of the control signal may be increased or decreased until a phase difference between the frequency of the oscillator circuit and the reference signal is less than a threshold value.

In some cases, the method further includes generating a coarse-tuning current using a reference voltage level, and adjusting the frequency of the oscillator circuit using the fine-tuning current and the coarse-tuning current. In a similar fashion to adjusting the first and second currents using respective variable resistors, the method may also include adjusting the coarse-tuning current using a third variable resistor, where a ratio between a value of the either the first or second resistor and the third resistor is constant during adjusting the first, second, and third variable resistors.

In various embodiments, the method further includes setting, during a calibration operation, respective initial values for the first, second, and third variable resistors. The method concludes in block 506.

Figure 6:
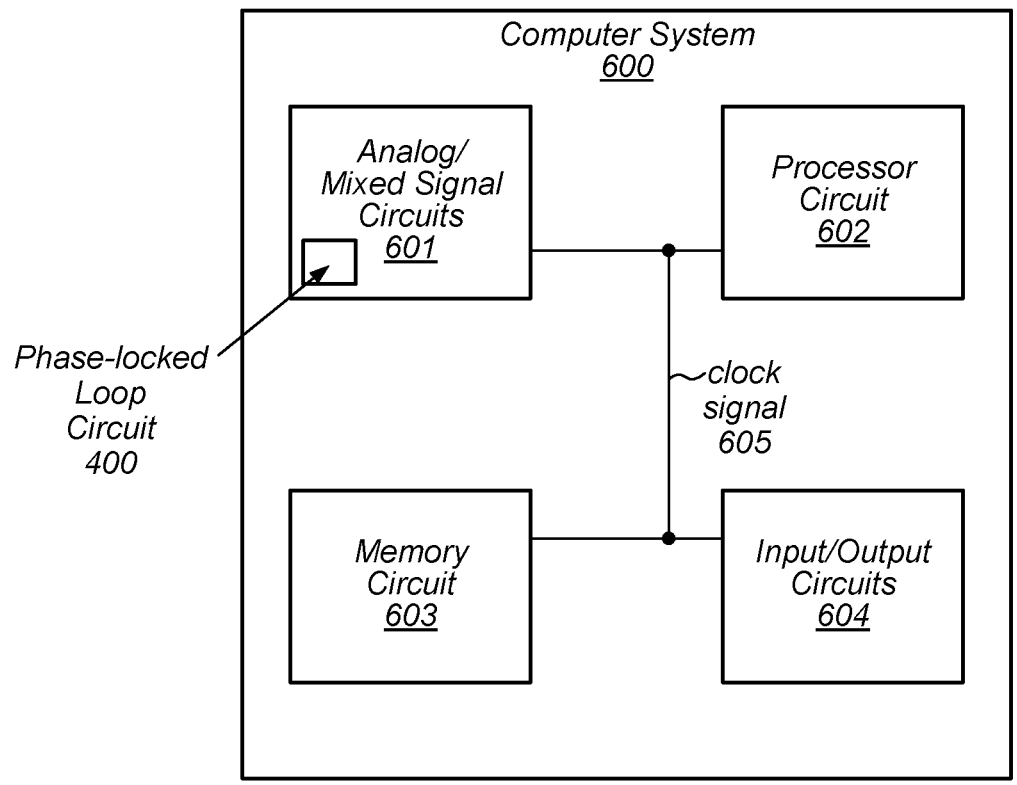
FIG. 6 illustrates a block diagram of a computer system.

A block diagram of computer system is illustrated in FIG. 6. In the illustrated embodiment, the computer system 600 includes power management unit analog/mixed signal circuits 601, processor circuit 602, memory circuit 603, and input/output circuits 604, each of which is coupled to clock signal 605. In various embodiments, computer system 600 may be a system-on-a-chip (SoC) and/or be configured for use in a desktop computer, server, or in a mobile computing application such as, e.g., a tablet, laptop computer, or wearable computing device.

Analog/mixed signal circuits 601 include phase-locked loop circuit 400, which is configured to generate clock signal 605 in order to provide a timing reference for processor circuit 602, memory circuit 603, and input/output circuits 804. Although analog/mixed signal circuits 601 is depicted as including a single phase-locked loop circuit, in other embodiments, any suitable number of phase-locked loop circuits may be included in analog/mixed signal circuits 601, each configured to generate a respective one of multiple clock signals included in computer system 600.

Processor circuit 602 may, in various embodiments, be representative of a general-purpose processor that performs computational operations. For example, processor circuit 602 may be a central processing unit (CPU) such as a microprocessor, a microcontroller, an application-specific integrated circuit (ASIC), or a field-programmable gate array (FPGA).

Memory circuit 603 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 6, in other embodiments, any suitable number of memory circuits may be employed.

Input/output circuits 604 may be configured to coordinate data transfer between computer system 600 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 604 may be configured to implement a version of Universal Serial Bus (USB) protocol or IEEE 1394 (Firewire®) protocol.

Input/output circuits 604 may also be configured to coordinate data transfer between computer system 600 and one or more devices (e.g., other computing systems or integrated circuits) coupled to computer system 600 via a network. In one embodiment, input/output circuits 604 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 604 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a coarse-tuning circuit configured to generate, based on a reference voltage level, a coarse-tuning current;
   a fine-tuning circuit that includes:
      a first current mirror circuit coupled to a power supply signal and configured to mirror a first initial current to generate a first current, wherein the first initial current is generated using a voltage level of a control signal and a first value of a first variable resistor; and
      a second current mirror circuit coupled to a ground signal and configured to mirror a second initial current to generate a second current, wherein the second initial current is generated using the voltage level of the control signal and a second value of a second variable resistor;
   wherein the fine-tuning circuit is configured to generate a fine-tuning current using the first current and the second current; and
   an oscillator circuit configured to generate a clock signal whose frequency is based on a combination of the coarse-tuning current and the fine-tuning current.

2. The apparatus of claim 1, wherein to generate the fine-tuning current, the fine-tuning circuit is further configured to sum the first current and the second current.

3. The apparatus of claim 1, wherein to generate the coarse-tuning current, the coarse-tuning circuit is further configured to compare the reference voltage level to a voltage drop across a third variable resistor through which the coarse-tuning current is flowing, wherein the third variable resistor includes the same number of unit cells as the first variable resistor.

4. The apparatus of claim 1, wherein the second current mirror circuit is a complement of the first current mirror circuit, wherein the first current mirror circuit includes a first device and a second device, and wherein to generate the first current the fine-tuning circuit is further configured to mirror the first initial current based on respective sizes of the first device and the second device.

5. The apparatus of claim 4, wherein the second current mirror circuit includes a third device and fourth device, and wherein to generate the second current, the fine-tuning circuit is further configured to mirror the second initial current based on respective sizes of the third and fourth devices, and wherein a type of third and fourth devices is different than a type of the first device and the second device.

6. A method, comprising:
   generating, based on a voltage level of a control signal, a first current using a first current mirror circuit;
   generating, based on the voltage level of the control signal, a second current using a second current mirror circuit that is a complement of the first current mirror circuit;
   adjusting the first current using a first variable resistor and adjusting the second current using a second variable resistor;
   combining the first current and the second current to generate a fine-tuning current;
   generating a coarse-tuning current using a reference voltage level; and
   adjusting a frequency of an oscillator circuit using the fine-tuning current and coarse-tuning current.

7. The method of claim 6, further comprising adjusting the coarse-tuning current using a third variable resistor, wherein a ratio between a value of either the first variable resistor or the second variable resistor and the third variable resistor is constant during adjusting the first, second, and third variable resistors.

8. The method of claim 7, further comprising, setting, during a calibration operation, respective initial values for the first, second, and third variable resistors.

9. The method of claim 6, further comprising, generating the control signal based on a comparison of the frequency of the oscillator circuit and a reference signal.

10. The method of claim 6, further comprising, filtering the control signal.

11. An apparatus, comprising:
   an oscillator circuit configured to generate a clock signal whose frequency is based on a voltage level of a control signal;
   a phase comparator circuit configured to generate the control signal using the clock signal and a reference signal; and a control circuit configured to:
  generate a first initial current based on the voltage level of the control signal and a first value of a first variable resistor;
  mirror the first initial current to generate a first current, wherein a value of the first current is based on respective sizes of a first set of devices included in the control circuit;
  generate, based on the voltage level of the control signal, a second current using a second set of devices that are complementary to the first set of devices;
  combine the first current and the second current to form a fine-tuning current;
  generate a coarse-tuning current using a reference voltage level; and
  adjust the voltage level of the control signal using the fine-tuning current and the coarse-tuning current.

12. The apparatus of claim 11, wherein to generate the second current, the control circuit is further configured to:
  generate a second initial current based on the voltage level of the control signal and a second value of a second variable resistor that includes a same number and type of unit cells as the first variable resistor; and
  mirror the second initial current to generate the second current whose value is based on respective sizes of devices included in the second set of devices.

13. The apparatus of claim 12, wherein to combine the first current and the second current, the control circuit is further configured to sum the first current and the second current.

14. The apparatus of claim 12, wherein the control circuit is further configured to generate, based on a third value of a third variable resistor, the coarse-tuning current using the reference voltage level, wherein the third variable resistor includes the same number and type of unit cells as the first variable resistor.

15. The apparatus of claim 11, further comprising a filter circuit configured to attenuate frequency components included in the control signal whose respective frequencies are greater a threshold value.

* * * * *